United States Patent [19]

Koch et al.

[11] Patent Number: 5,413,884
[45] Date of Patent: May 9, 1995

[54] GRATING FABRICATION USING ELECTRON BEAM LITHOGRAPHY

[75] Inventors: Thomas L. Koch, Holmdel; Frederick W. Ostermayer, Jr., Berkeley Heights; Donald M. Tennant, Freehold; Jean-Marc Verdiell, Matawan, all of N.J.

[73] Assignee: American Telephone and Telegraph Company, New York, N.Y.

[21] Appl. No.: 989,690

[22] Filed: Dec. 14, 1992

[51] Int. Cl.$^6$ ............................................. G03F 9/00
[52] U.S. Cl. ....................................... 430/5; 430/321; 430/323; 430/394
[58] Field of Search ................... 430/5, 321, 323, 326, 430/328, 394

[56] References Cited

U.S. PATENT DOCUMENTS

| | | | |
|---|---|---|---|
| 4,517,280 | 5/1985 | Okamoto et al. | 430/321 |
| 4,748,132 | 5/1988 | Fukuzawa et al. | 437/25 |
| 4,846,552 | 7/1989 | Veldkamp et al. | 350/162.2 |

FOREIGN PATENT DOCUMENTS

3238454 10/1991 Japan .

OTHER PUBLICATIONS

"Performance of 1.5um λ/4–Shifted DFB–SIPBH Laser Diodes with Electron Beam Defined and Reactive Ion–Etched Gratings", *Electronics Letters*, 11th May 1989, vol. 25, No. 10, C. E. Zah et al. pp. 650 and 651.

"Novel method to fabricate corrugation for a λ/4--shifted distributed feedback laser using a grating photomask", *Appl. Phys. Lett.*, 55(5), 31 Jul. 1989, M. Okai et al. pp. 415 through 417.

"Facetless Bragg reflector surface-emitting AlGaAs/-GaAs lasers fabricated by electron–beam lithography and chemically assisted ion–beam etching", *J. Vac. Sci. Technol.*, vol. 9, No. 6, Nov./Dec. 1991 pp. 2842 through 2845.

*Primary Examiner*—Steve Rosasco

[57] ABSTRACT

A technique is disclosed for utilizing direct-write electron-beam photolithography and holographic optical exposure to form gratings in optoelectronic structures. The direct-write e-beam process is used to form rectangular grating teeth in a mask substrate, where the mask is then used as a phase mask to transfer the pattern to the optoelectronic device. Advantageously, the utilization of a direct write e-beam technique to form the grating pattern on the photomask allows for the formation of any desired number and location of abrupt phase shifts, multiple grating pitches, alignment fiducials, and any other desired features. Therefore, a single exposure of the direct write e-beam mask allows for a plurality of different grating patterns to be simultaneously printed.

26 Claims, 6 Drawing Sheets

5 μm

GRATING FABRICATION USING ELECTRON BEAM LITHOGRAPHY

BACKGROUND OF THE INVENTION

1. Technical Field

The present invention relates to a technique for fabricating gratings in optoelectronic and optical devices and, more particularly, to a fabrication technique utilizing a combination of electron-beam lithography and holographic optical exposure.

2. Description of the Prior Art

Corrugated waveguide gratings are considered to be key elements for many optical devices, such as filters, distributed feedback (DFB) lasers, and distributed Bragg reflector (DBR) lasers, where such devices are expected to play a significant role in future lightwave communication systems. The fabrication of corrugated waveguides is often accomplished utilizing a holographic technique, as taught in U.S. Pat. No. 4,517,280, entitled "Process for Fabricating Integrated Optics", issued to K. Okamoto et al. on May 14, 1985. As is known in the art, such a holographic technique relies on the exposure of resists using two interfering UV laser beams. The interference pattern allows for the formation of submicron-pitch gratings, but is limited in the different variety of features which can be made during a single process step.

Another technique that has been used extensively to fabricate corrugated grating structures for optoelectronic or optical device applications is direct-write electron-beam (e-beam) lithography. In this technique, the desired periodic features are exposed by an electron beam directly in an e-beam sensitive resist (such as PMMA) that covers the substrate which is to contain the final grating structure. Indeed, this technique has demonstrated the desired versatility of forming abrupt phase shift, as well as multiple grating pitches on a single wafer. See, for example, an article entitled "Performance of 1.5 $\mu$m $\lambda/4$-Shifted DFB-SIPBH Laser Diodes" by C. E. Zah et al., appearing in *Elector Letters*, Vol. 25, No. 10, May 1989, at pp. 650–1. The principal drawback of this technique is the requirement that each wafer or substrate be individually processed. That is, each must experience the entire direct-write electron-beam process, including loading the sample into a vacuum chamber, as well as the precision alignment and (usually) very lengthy direct-write exposure process itself. As such, the direct-write electron-beam exposure of large-area features, such as gratings for optoelectronic or optical devices, is not viewed as a manufacturable process.

An alternative technique is discussed in an article entitled "Novel method to fabricate corrugation for a $\lambda/4$-shifted distributed feedback laser using a grating photomask", by M. Okai et al. appearing in *Applied Physics Letters*, Vol. 55, No. 5, July 1989, at pp. 415–6. In this case, a precision ruling machine is used to form a metal substrate with triangular grooves. This triangular groove pattern is then transferred to a transparent polymer film, which results in a triangular-wave phase mask. When illuminated off-axis, this mask will generate a diffracted beam which will interfere with the transmitted beam to produce an interference pattern similar to that observed in the conventional two-beam holographic interference method. The modulation resulting from the interference pattern in the intensity on the far side of the mask is intended to expose resist which has been placed on the actual sample to be patterned. However, the triangular phase mask is incapable of generating the equal intensities of transmitted and diffracted beams which are required to obtain a high contrast-ratio interference pattern suitable for resist exposure. This is remedied, at the expense of overall intensity and thus longer exposure time, by evaporating a metal film, off-axis, to asymmetrically coat the triangular grating features on the polymer mask, and thus equalize the transmitted and diffracted beam intensities. This technique is also currently understood to require a laser exposure system similar to the conventional two-beam holographic interference method. The utilization of the ruling machine to form the gratings allows for the mask to be modified, as desired, to incorporate pitch changes (and therefore phase shifts) within the grating during a single print.

Although the Okai et al. mask provides for improved fabrication techniques, the flexibility of their approach is still somewhat limited, especially by the mechanical ability of the ruling machine with respect to the number of grooves per millimeter which may be formed.

SUMMARY OF THE INVENTION

The need remaining in the prior art is addressed by the present invention which relates to a technique for fabricating gratings in optoelectronic and optical devices and, more particularly, to a fabrication technique utilizing a combination of electron-beam lithography and holographic optical exposure.

In accordance with an exemplary embodiment of the present invention, direct write e-beam lithography and reactive ion etching are used to fabricate square-wave gratings on a mask substrate. The square waves produced by the proposed method are capable, with proper choice of depth, of producing equal intensities in the transmitted and diffracted beams without additional amplitude gratings, as in the method of Akai et al. The mask is then used as a pure phase mask for the near-field holographic printing of gratings on a device substrate.

An advantage of utilizing direct write e-beam lithography in accordance with the present invention is the ability to print abrupt phase shifts, multiple grating pitches (in regions disposed both parallel and perpendicular to the grating lines) and other fine features (e.g., fiducial markings), where all such gratings and other features may be simultaneously exposed as a single optical masking step. The proposed technique thus permits the capabilities of direct-write electron-beam lithography without the serial, slow direct writing of each wafer and further provides for the fabrication of a square wave pattern, which is not possible with a replicating, ruling machine as used by Okai et al. A single, robust mask is made with features that may be uniquely possible using electron-beam lithography, and this phase mask is then used in a fast, simple holographic optical printing procedure on the actual sample.

Another advantage of the present invention, learned through extensive experimentation, is that a laser source may not be required to achieve high-contrast interference after the phase mask. In particular, it has been found that a mercury arc lamp, with some optical filtering to limit the spectrum to predominantly one line, is sufficient. The source must be collimated, and emanate from a small source to provide a moderate degree of spatial coherence; however, such a source is much more robust and easy to use than a typical ultraviolet laser, as is commonly used in the two-beam interference method or the method as taught by Okai et al. Therefore, the technique of the present invention allows for the mass fabrication of arbitrarily complex grating-based structures for optical or optoelectronic devices with submicron pitches using nearly conventional optical apparatus as is commonly found in current clean room processing environments. Further, other conventional features (e.g., alignment features, fiducials, etc.) may also be formed on the mask.

A further advantage lies in the robust nature of the mask formed by direct-write electron-beam lithography. In most cases, a quartz material can be used to form the mask and may be re-exposed thousands of times and cleaned using standard cleaning procedures, a result of the inherent nature of the mask.

Other and further advantages of the present invention will become apparent during the course of the following discussion and by reference to the following drawings.

BRIEF DESCRIPTION OF THE DRAWINGS

Referring now to the drawings, where like numerals represent like parts in several views, FIG. 1 (not to scale) illustrates an exemplary phase mask formed using a direct-write electron-beam lithography process in accordance with the present invention, and the near-field intensity pattern resulting therefrom.

DETAILED DESCRIPTION

Figure 1:
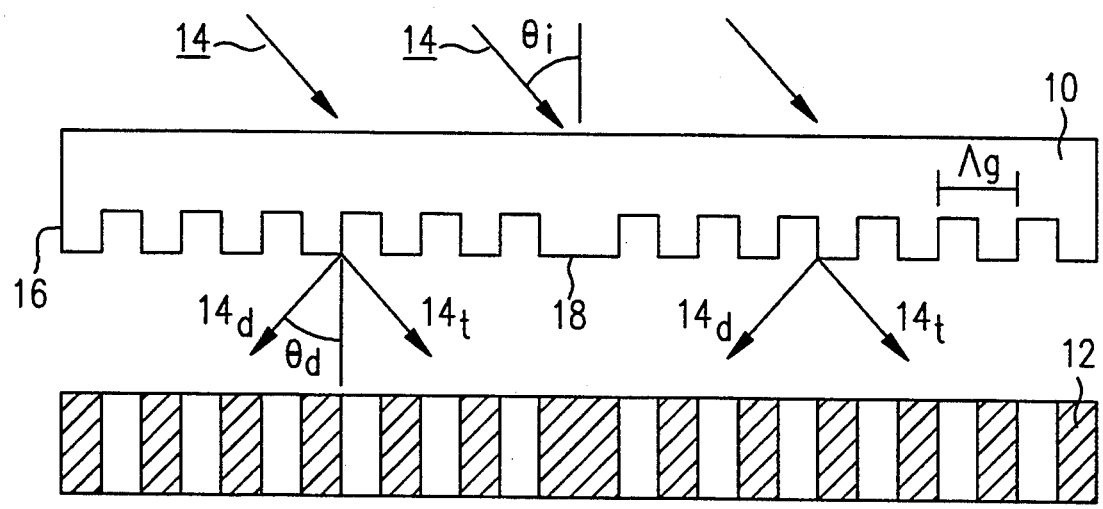

The principles of the direct-write electron-beam mask printing are illustrated in FIG. 1. In particular, a rectangular-wave phase mask 10 produced by e-beam lithography and associated near-field intensity pattern 12 are shown. UV illumination 14 from an exposure source (not shown) is incident on mask 10 at a predetermined angle $\theta_i$ with respect to the normal. Illumination 14 propagates through mask 10, where portions of the illumination are delayed in phase as they pass through grating teeth 16 formed on the surface of mask 10. As will be described in detail below, grating teeth 16 are formed using the direct write e-beam technique of the present invention. Referring back to FIG. 1, illumination 14 is partially transmitted (zero order) through mask 10, denoted as $14_t$, and partially diffracted (first-order), denoted $14_d$. Diffracted beams $14_d$ exit mask 10 at an angle $\theta_d$ with respect to the normal. Transmitted beams $14_t$ and diffracted beams $14_d$ then function similar to the two-beam interference holographic process, well-known in the art and discussed in the references cited above, resulting in a periodic intensity variation 12 in the near-field, the period of the variation being the spatial period $\Lambda_g$ of grating teeth 16 formed in mask 10. Intensity variation 12, as shown, varies in light and dark regions and can then be used to expose a photoresist-covered substrate (not shown) to form the desired grating pattern in the photoresist on the substrate surface.

Figure 2:
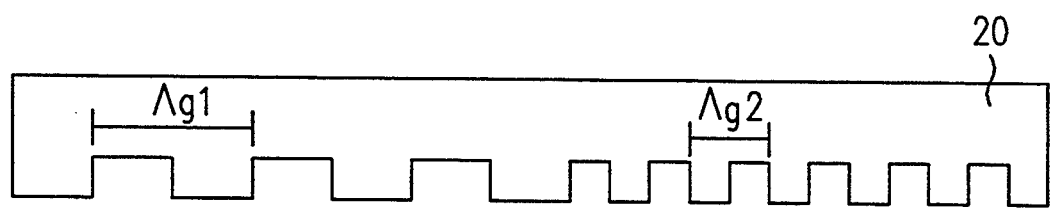
FIG. 2 illustrates an alternative mask, also formed using direct write e-beam lithography, including a plurality of different grating pitches.
Figure 3:
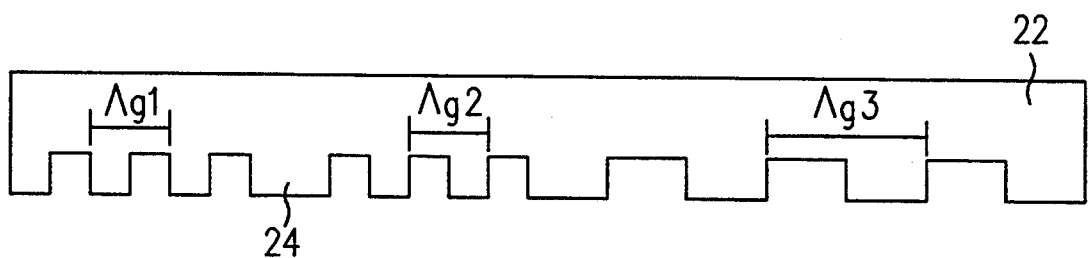
FIG. 3 illustrates yet another direct write e-beam mask, formed in accordance with the present invention to include both an abrupt phase shift and multiple grating pitches.

The exemplary grating teeth 16 of mask 10 are defined as comprising a spatial period, or pitch, $\Lambda_g$, with an abrupt half-period phase shift 18 ($\Lambda_g/2$) formed as shown. Such an abrupt phase shift is often required in optical components, for example, phase-shifted DFB lasers. As mentioned above, the direct write e-beam process used to form grating teeth 16 in mask 10 easily allows for the formation of such an abrupt phase shift, merely by controlling the writing process. Multiple phase shifts may also be formed, as shown in FIG. 2, which illustrates an exemplary mask 20 including two different grating pitches, $\Lambda_{g1}$ and $\Lambda_{g2}$. FIG. 3 illustrates an exemplary mask 22 including both an abrupt phase shift 24 and multiple grating pitches.

Figure 4:
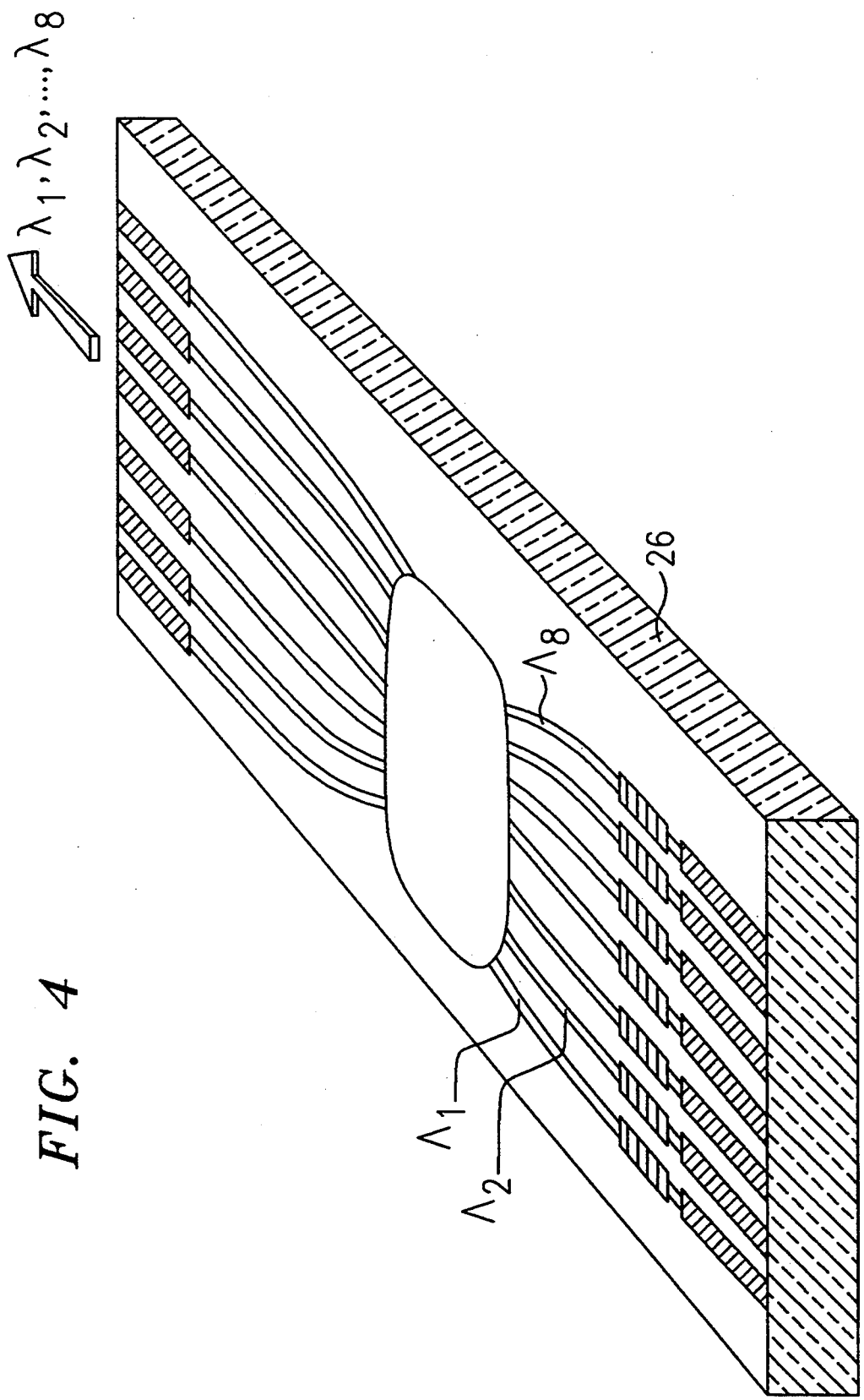
FIG. 4 illustrates an exemplary photonic integrated circuit, in particular, a wavelength division multiplexed transmitter array, formed using a mask fabricated in accordance with the present invention.
Figure 5:
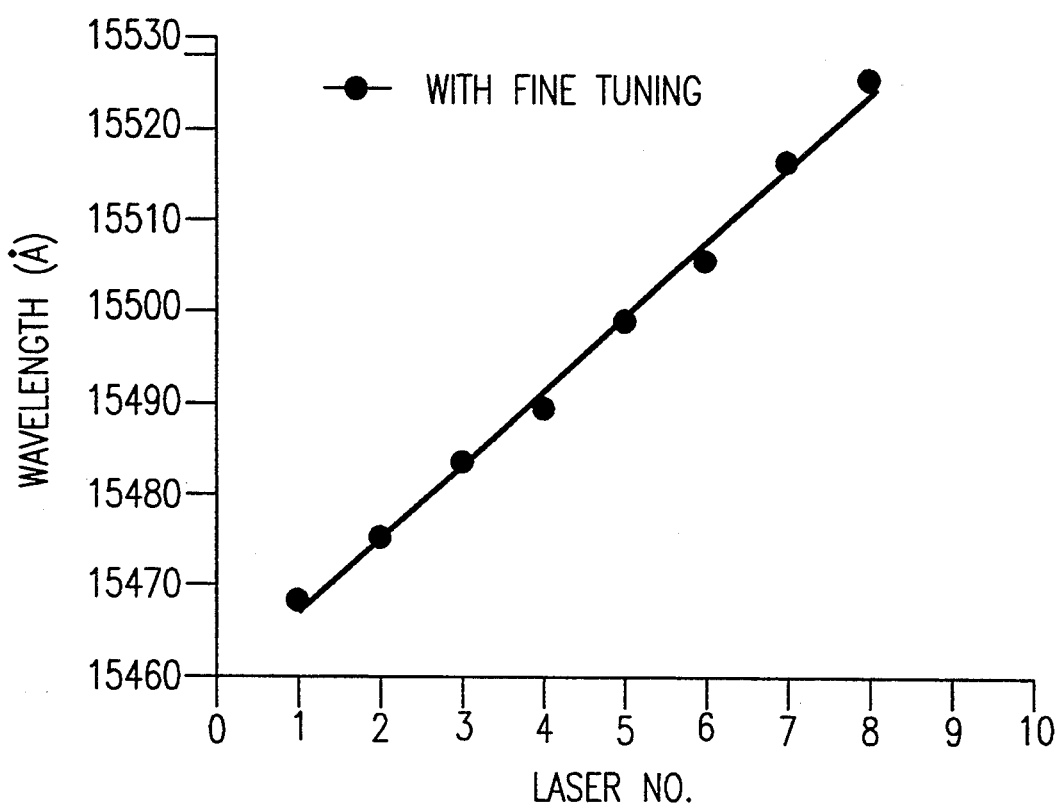
FIGS. 5 and 6 contain various data related to grating pitch and wavelength for the plurality of transmitters illustrated in FIG. 4.
Figure 6:
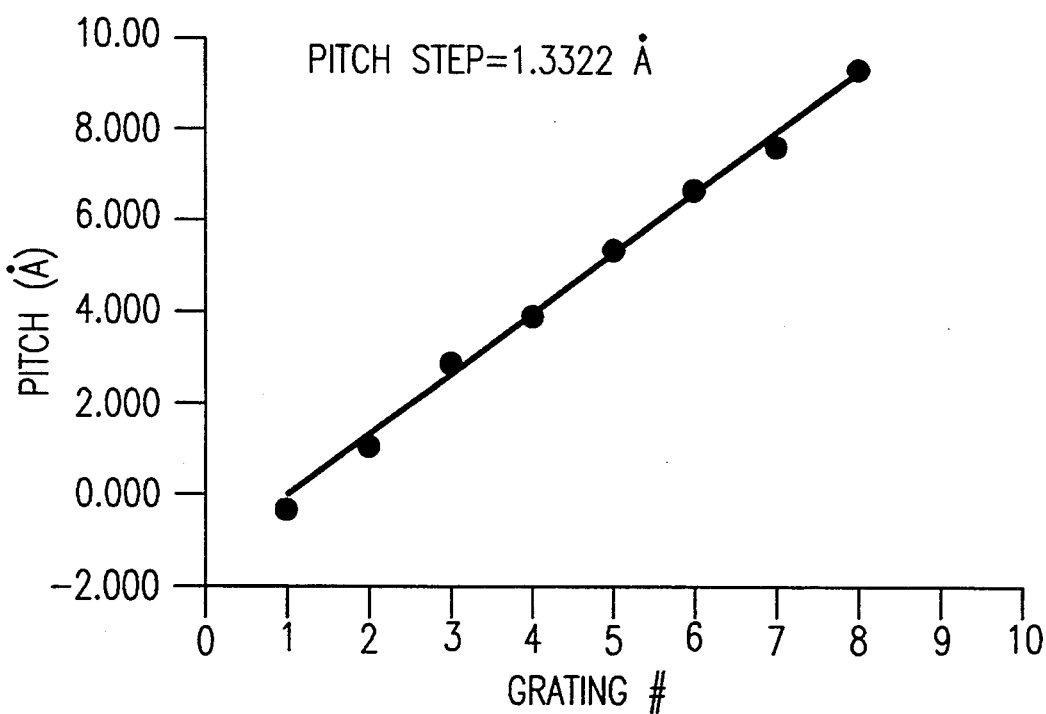

As mentioned above, multiple pitches may be created in the dimension perpendicular to the drawing, or, alternatively, laterally disposed (i.e., parallel) along the substrate, so as to allow for different optical devices operating at different wavelengths to be simultaneously produced on the same substrate. Such an application is shown in FIG. 4, which illustrates a multi-wavelength array 26 single-frequency distributed Bragg reflector (DBR) semiconductor lasers. In fabricating this particular structure, the exposure may be accomplished using a mercury arc lamp source and a pure phase rectangular wave photomask produced by electron-beam lithography, using the techniques of the present invention as discussed above. In particular, a plurality of eight lasers is illustrated, fabricated on, for example, 508 μm center-to-center spacings between each laser, where each laser comprises a different grating pitch $\Lambda_1, \Lambda_2, \ldots \Lambda_8$, as shown in FIG. 4. FIG. 5 illustrates the relative pitch (in Å) for each of the eight lasers. When lasers were made from the resulting wafer, the wavelengths of the lasers had the desired eight Å wavelength separations, as shown in FIG. 6. Using prior art technology, such a narrow separation would only have been possible from utilizing either eight successive two-beam holographic exposures, or a slow direct-write electron-beam direct exposure of the wafer itself, where neither of these processes are considered suitable for manufacture.

In general, the direct-write electron-beam lithography process of forming a phase mask may be used to include any desired type of grating features. In particular, the inventive method may be used to incorporate curved grating lines to form, for example, structures of focusing in the plane of the wafer, as discussed in U.S. Pat. No. 4,923,271, entitled "Optical Multiplexer/-Demultiplexer Using Focusing Bragg Reflectors", issued to C. H. Henry et at. on May 8, 1990 and assigned to the assignee of the present application.

For the exemplary arrangement shown in FIG. 1, only the zero order transmitted beam 141 and first-order diffracted beam $14_d$ are illustrated. In general, a grating with a known pitch of $\Lambda_g$ will also produce a plurality of m higher order diffracted beams, with k x values defined as follows:

$$k_{xm} = k_{xo} + m2\pi/\Lambda_g$$

where $$k_{xo} = (2\pi/\lambda) \sin \theta_i,$$

where $\lambda$ is the wavelength of the illumination. For conventional photolithography applications in accordance with the teachings of the present invention, grating pitch $\Lambda_g$ is approximately 240 nm and $\lambda$ is approximately 364 nm. In order to satisfy the condition $k_{xm} < 2\pi/\lambda$, (required for non-evanescent propagation), only m=0 and m=−1 satisfy the above equations. For the values of $\Lambda_g$ and $\lambda$ used in this example, it has been found that to generate any diffracted wave also requires that $\sin\theta_i > \lambda/\Lambda_g - 1$, or $\theta_i > 31°$.

Figure 7:
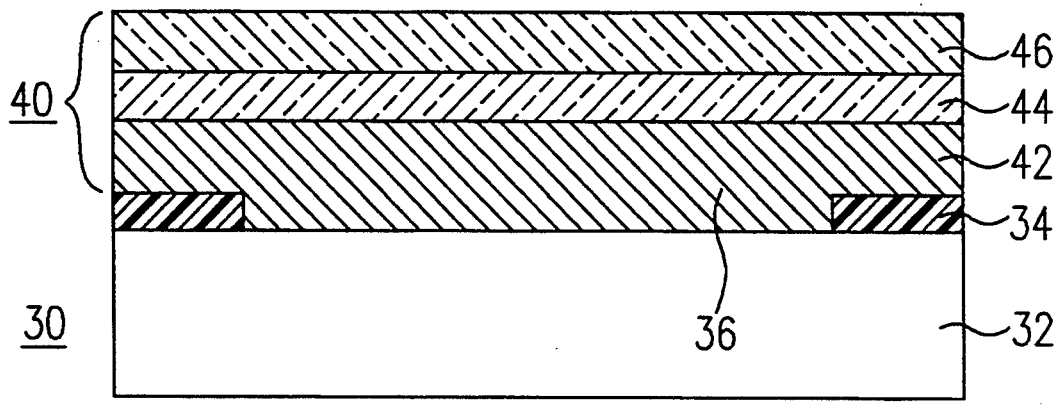
FIGS. 7–11 illustrate, in sequence, an exemplary set of processing steps which utilize a direct-write electron-beam lithography process to form a phase mask in accordance with the present invention.
Figure 8:
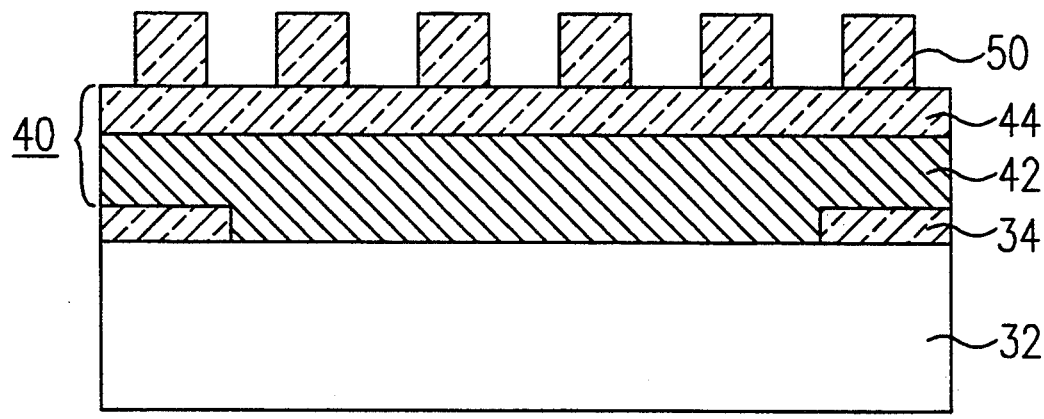

FIGS. 7–11 illustrate an exemplary process of utilizing direct-write electron-beam lithography to fabricate a photomask in accordance with the teachings of the present invention. FIG. 7 illustrates a starting photomask blank 30. Blank 30 comprises a substrate 32 (such as quartz, for example ) with, in some exemplary cases, an (optional) overlying chromium layer 34. Chromium layer 34 has been previously processed (patterned and etched) to expose the areas 36 of substrate 32 which are to be patterned. An exemplary e-beam sensitive resist 40 is subsequently deposited over substrate 32 and chromium layer 34. For the exemplary process described below, a tri-level resist is used. It is to be understood that any suitable single layer resist (such as PMMA) or multi-layer e-beam sensitive resist may be used in practicing the present invention. Referring to FIG. 7, the exemplary tri-level resist comprises a first layer 42 of a conventional hard-baked photoresist, a second, layer 44 of germanium thinner than first layer 42, and a third layer 46 of an e-beam sensitive resist.

Figure 9:
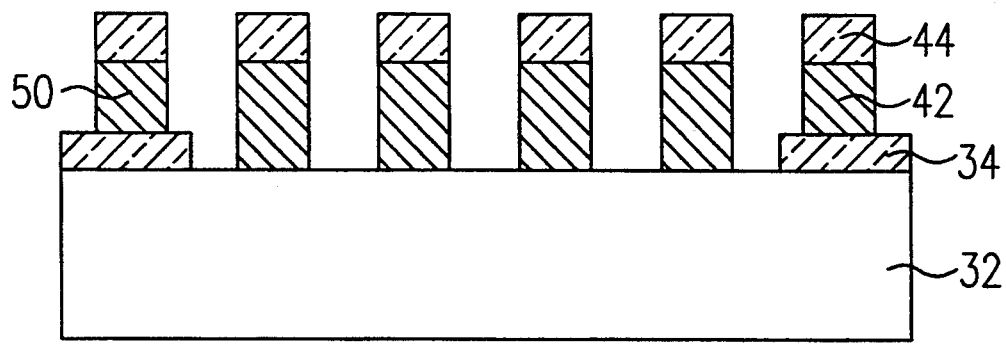

The desired square-wave pattern 50 for forming the predetermined phase mask is then formed, using an electron beam source (not shown). In accordance with the teachings of the present invention, the utilization of a direct write e-beam source to form pattern 50 allows for great flexibility in forming any desired number and location of both multiple grating pitches and abrupt phase shifts, as discussed above and illustrated in FIGS. 1–4. It is envisioned that in addition to direct-write electron-beam lithography, focused ion beams may also be suitable in some cases for the exposure process. After development of resist layer 46, (using, for example, a 1:2 solution of methyl isobutyl ketone:isopropanol) the unexposed resist material is removed and the structure resembles that illustrated in FIG. 8, which illustrates the desired grating pattern 50 as being transferred to resist layer 46. Pattern 50 is then transferred into the underlying first and second resist layers 42 and 44, using a reactive ion etch (RIE) process. An exemplary RIE process suitable for use with the particular resist materials mentioned above may comprise a first RIE using $CF_3Br$ for etching layer 44, followed by a second RIE using $O_2$ for etching layer 42. The structure of the mask at the end of these RIE processes is illustrated in FIG. 9.

Figure 10:
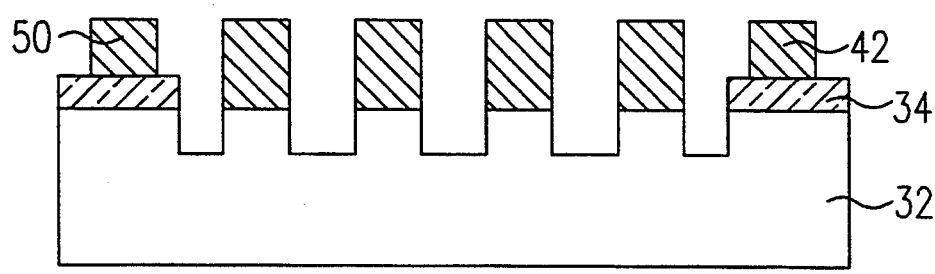
Figure 11:
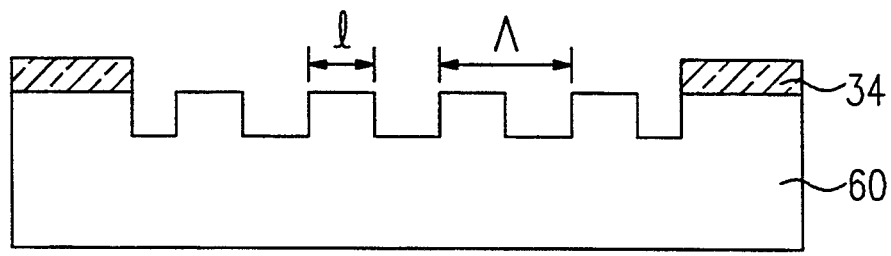

A further RIE process (using $CHF_3$, for example) is then performed to transfer pattern 50 into substrate 32, as shown in FIG. 10. The final process step requires the removal of any remaining mask material (using RIE in $O_2$), to form the final mask structure 60, as shown in FIG. 11. Typical grating pitches made using this technique can range, for example, from 190 nm to 250 nm. The gratings may be 5–20 $\mu$m long (with longer lines possible, but adding extensive writing time). The length of the grating regions may extend for the complete length of the mask, which may be several centimeters.

Figure 12:
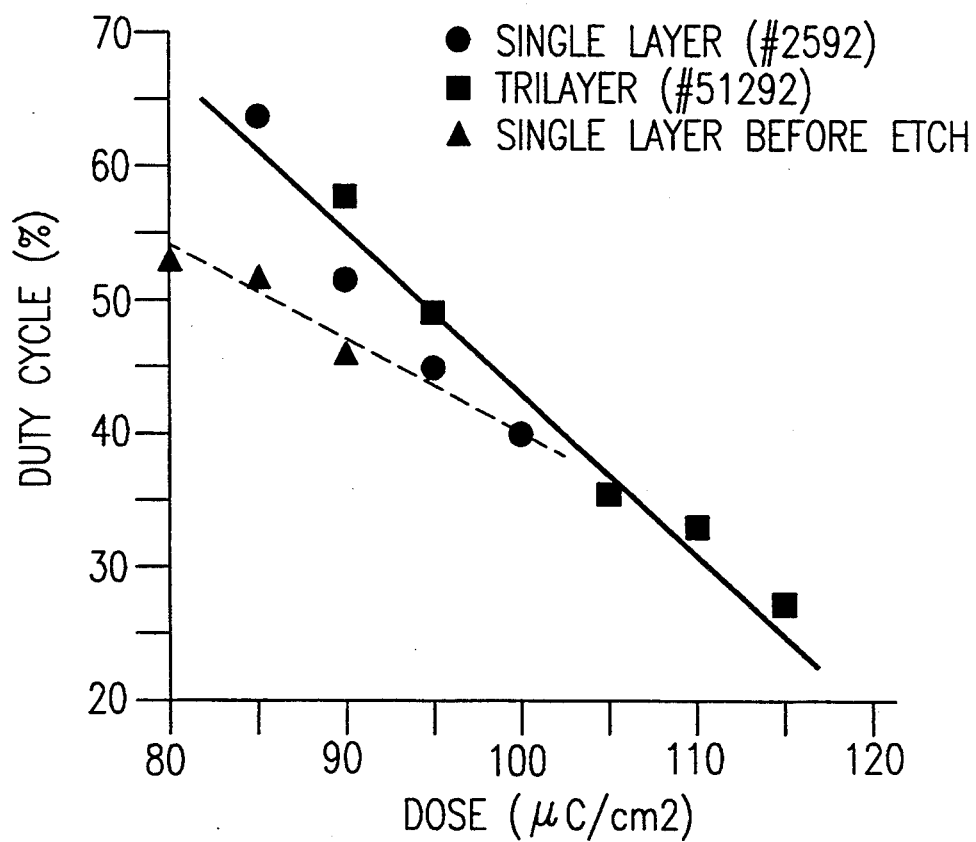
FIG. 12 illustrates the relationship between duty cycle and e-beam aerial dosage at a fixed energy of 50 keV.

During the various RIE processes described above, the duty cycle of pattern 50 may vary, where the duty cycle is defined as the length l of a feature divided by the pitch A. In particular, an RIE process with $CHF_3$ may deposit polymer material on the sidewalls of the gratings while removing the material from the bottom of the grooves. FIG. 12 illustrates the duty cycle (%) variation as a function of e-beam dosage for both single layer and tri-layer resists. Using such data, e-beam dosage may be adjusted to compensate for processing offsets to produce the duty cycles that would be desired to achieve equal intensifies in the transmitted and diffracted beams.

Figure 13:
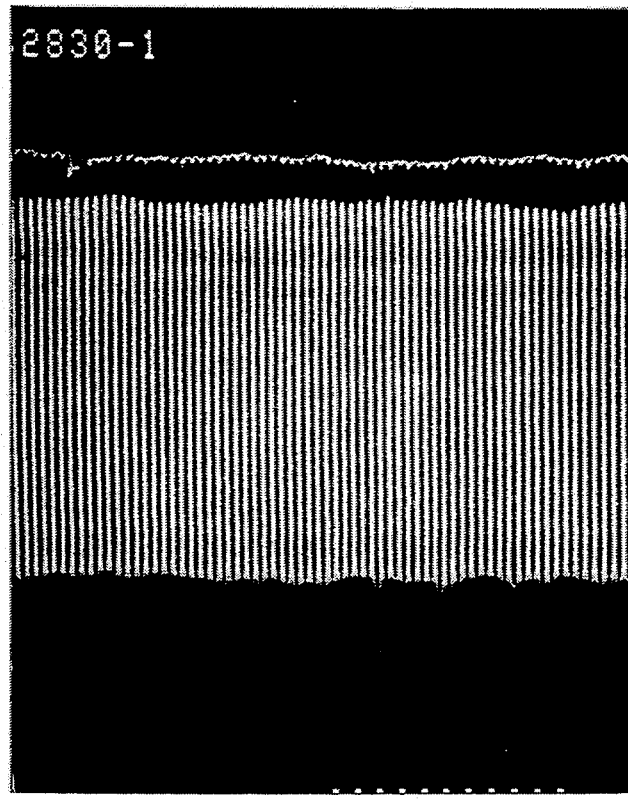
FIG. 13 contains scanning electron micrographs of gratings exposed and developed in a UV photoresist on InP, using an e-beam mask and illuminated with an argon laser.
Figure 14:
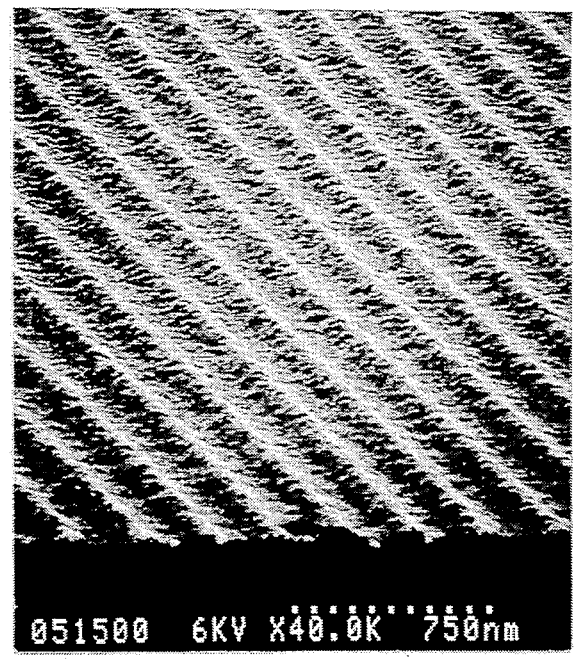
FIG. 14 contains scanning electron micrographs of gratings exposed and developed in a UV photoresist on InP, using the same e-beam mask as used to form the gratings shown in FIG. 13, illuminated with a mercury lamp.

An advantage of utilizing a photomask formed using the direct-write e-beam lithography technique of the present invention is that gratings may be printed ncoherent source is appropriate as long as the substrate is located in the near-field of the mask (within 10 $\mu$m, for example) and the source is small in area to provide a moderate degree of spatial coherence. The incoherent source may require some degree of spectral filtering to achieve a moderate level of temporal coherence as well, but the overall coherence requirement is dramatically reduced when compared with the conventional two-beam interference method of holographic exposure. FIG. 13 contains a scanning electron micrograph (SEM) of an exemplary grating structure formed in photoresist which was printed using an argon laser source to illuminate a direct write e-beam mask. FIG. 14 contains a SEM of another grating structure, also formed in photoresist and using the same mask as used in conjunction with FIG. 13, the difference being the mask was in this case illuminated with an exemplary incoherent source (the triplet at 365 nm from a mercury/xenon arc lamp with a 0.25 mm source size).

We claim:

1. A method of fabricating predetermined grating structures in optoelectronic devices, the method comprising the steps of:
   a) providing a photomask including a grating pattern of rectangular grating features formed by a direct-write electron-beam lithography process, said grating pattern comprising any desired number and location of abrupt phase shifts and plurality of grating pitches;
   b) illuminating said photomask with light at a predetermined angle $\theta_i$ sufficient to form a transmitted beam and a first-order diffracted beam;
   c) exposing a photoresist-covered optoelectronic device substrate, such that the transmitted beam and first-order diffracted beam interfere to form a near-field intensity pattern in said photoresist which replicates said grating pattern; and d) developing said photoresist and transferring said grating pattern to the underlying optoelectronic device substrate.

2. The method according to claim 1 wherein in performing step a), providing a pure phase mask.

3. The method according to claim 1 wherein the plurality of rectangular grating features comprise a plurality of square grating features.

4. The method according to claim 1 wherein in performing step a), said grating pattern is formed using a direct-write electron-beam technique to include at least one abrupt phase shift.

5. The method according to claim 4 wherein the in performing step a), said direct-write electron-beam lithography technique is used to form an abrupt phase shift of $\Lambda/2$, where $\Lambda$ is defined as the pitch of the grating pattern.

6. The method according to claim 1 wherein in performing step a), said grating pattern is formed using a direct-write electron-beam lithography technique to include a plurality of different grating pitches ($\Lambda_1, \Lambda_2, \ldots$).

7. The method according to claim 6 wherein the plurality of grating pitches vary in a direction perpendicular to the grating structure.

8. The method according to claim 6 wherein the plurality of grating pitches vary in a direction parallel to the grating structure.

9. The method according to claim 1 wherein in performing step b), the illumination is provided at an angle $\theta_i$ greater than 31° with respect to the normal of said photomask.

10. The method according to claim 1 wherein in performing step b), the photomask is illuminated with a coherent UV source.

11. The method according to claim 10 wherein in performing step b), the coherent UV source comprises an argon laser source.

12. The method according to claim 1 wherein in performing step b), the photomask is illuminated with an incoherent UV source.

13. The method according to claim 12 wherein in performing step b), the incoherent UV source comprises a mercury/xenon lamp.

14. The method according to claim 13 wherein the mercury/xenon lamp source is filtered to form approximately a single line, small spot size illumination.

15. A method of forming a direct write e-beam photomask, the method comprising the steps of:
   a) providing a mask substrate, patterned with a masking layer to delineate the areas of said mask substrate to be exposed;
   b) depositing an e-beam sensitive resist to the surface of the substrate provided in step a);
   c) writing, using an e-beam source, a predetermined rectangular grating pattern in the resist deposited in step b);
   d) developing said resist after completing the writing operation of step c);
   e) reactive ion etching said developed resist to form said predetermined rectangular grating pattern in said resist layer; and
   f) transferring, using reactive ion etching, said predetermined rectangular grating pattern into the surface of said mask substrate.

16. The method according to claim 15 wherein in performing step a), a quartz substrate with a chromium masking layer is provided.

17. The method according to claim 15 wherein in performing step b), a single layer e-beam sensitive resist is deposited.

18. The method according to claim 17 wherein PMMA is utilized.

19. The method according to claim 15 wherein in performing step b), a tri-layer e-beam sensitive resist is deposited using the following steps:
   1) depositing a first layer of a hard-baked photoresist;
   2) depositing a second layer of germanium to overly said first layer wherein said second layer is thinner than said first layer; and
   3) depositing a third layer of e-beam sensitive resist to overly said second layer.

20. The method according to claim 19 wherein in performing step d), the developing comprises the steps of:
   1) developing the third resist layer in a solution of 4:1 methyl isobutyl ketone: isopropanol to form the predetermined grating pattern;
   2) reactive ion etching using $CF_3Br$ to transfer said predetermined grating pattern into said germanium second resist layer;
   3) reactive ion etching using $O_2$ to transfer said predetermined grating pattern into said hard baked first resist layer; and
   4) reactive ion etching using $CHF_3$ to transfer said predetermined grating pattern into the substrate.

21. The method according to claim 15 wherein in performing step c), said predetermined rectangular grating pattern includes a plurality of different grating pitches.

22. The method according to claim 15 wherein in performing step c) said predetermined rectangular grating pattern includes at least one abrupt phase shift.

23. The method according to claim 22 wherein the at least one abrupt phase shift comprises a $\Lambda/2$ phase shift, where $\Lambda$ is defined as the grating pitch.

24. The method according to claim 15 wherein in performing step c), said predetermined rectangular grating pattern includes a plurality of different grating pitches and at least one abrupt phase shift.

25. The method according to claim 24, wherein in performing step c), forming a plurality of rectangular grating structures wherein the different grating pitches vary in a direction perpendicular to the grating structures.

26. The method according to claim 24, wherein in performing step c), forming a plurality of rectangular grating structures wherein the different grating pitches vary in a direction parallel to the rectangular grating structures.

* * * * *